(12) United States Patent
Choi et al.

(10) Patent No.: US 7,839,079 B2
(45) Date of Patent: Nov. 23, 2010

(54) ORGANIC LIGHT EMITTING DISPLAY PREVENTING VOLTAGE OR CURRENT DROPDOWN IN POWER CONDUCTIVE LINES

(75) Inventors: Hongseok Choi, Seoul (KR); Seungtae Kim, Seoul (KR); Woochan Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 441 days.

(21) Appl. No.: 11/949,989

(22) Filed: Dec. 4, 2007

(65) Prior Publication Data

US 2008/0197770 A1 Aug. 21, 2008

(30) Foreign Application Priority Data

Feb. 20, 2007 (KR) .................. 10-2007-0017194
Nov. 29, 2007 (KR) .................. 10-2007-0122903

(51) Int. Cl.
*H01L 51/00* (2006.01)
*G09G 3/30* (2006.01)

(52) U.S. Cl. .................. 313/504; 313/506; 345/76

(58) Field of Classification Search .................. 313/504, 313/506; 345/76
See application file for complete search history.

(56) References Cited

U.S. PATENT DOCUMENTS

| 2002/0011976 A1* | 1/2002 | Hashimoto ................ 345/76 |
| 2005/0162353 A1* | 7/2005 | Kanda ..................... 345/76 |
| 2007/0103063 A1* | 5/2007 | Kim ....................... 313/504 |

* cited by examiner

*Primary Examiner*—Karabi Guharay
(74) *Attorney, Agent, or Firm*—Morgan Lewis & Bockius LLP (57) ABSTRACT

An organic light emitting device includes a display unit having a plurality of sub-pixels and a plurality of conductive lines. The conductive lines include a main power conductive line disposed in a first direction to supply power to the sub-pixels, at least one division power conductive line connected to the main power conductive line and disposed in a second direction different from the first direction, and a sub-power conductive line connected to the division power conductive line and disposed opposite to the main power conductive line. A width of the main power conductive line is greater than widths of the division power conductive line and the sub-power conductive line.

16 Claims, 4 Drawing Sheets

ORGANIC LIGHT EMITTING DISPLAY PREVENTING VOLTAGE OR CURRENT DROPDOWN IN POWER CONDUCTIVE LINES

This application claims the benefit of Korean Patent Application No. 10-2007-0017194 filed Feb. 20, 2007 and No. 2007-0122903 filed Nov. 29, 2007, the subject matters of which are incorporated herein by reference.

BACKGROUND

1. Field

One or more embodiments described herein relate to a display device.

2. Background

The importance of flat panel displays has recently increased with consumer demand for multimedia products and services. An organic light emitting device (OLED) is desirable because it has a rapid response time, low power consumption, self-emission structure, and wide viewing angle. In spite of their many advantages, OLEDs tend to have non-uniform luminance characteristics which degrade reliability.

DETAILED DESCRIPTION

In an organic light emitting device, sub-pixels are disposed in a matrix format within a display unit and emit light based on scan, data, and power signals received from one or more external devices. When power is supplied to certain types of organic light emitting displays, current or voltage drops occur due to resistance in power conductive lines. As a result, the power supplied through these lines deviates substantially, causing a deterioration in display quality.

Figure 1A:
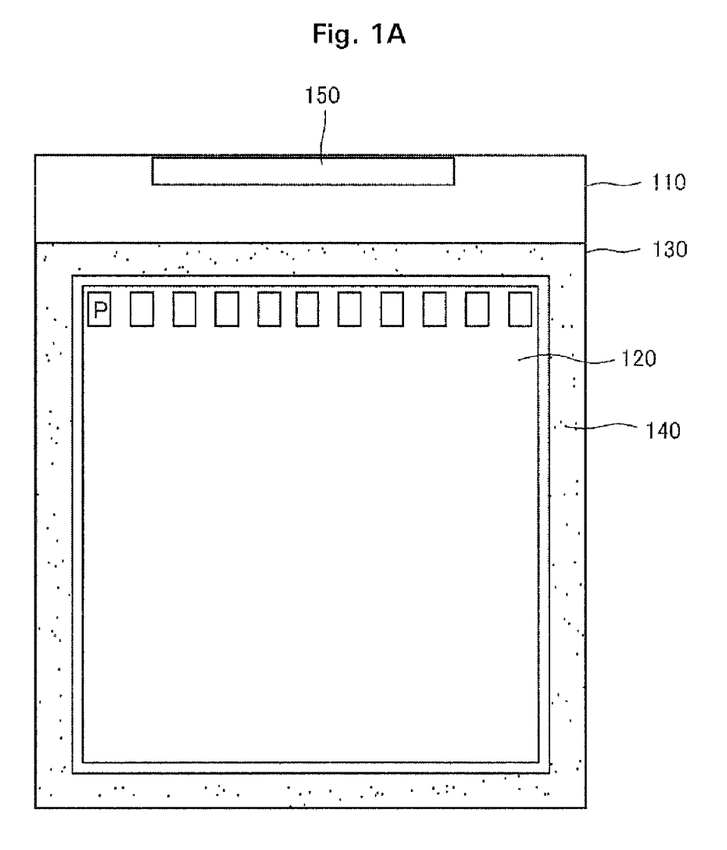
FIG. 1A is a diagram of one embodiment of an organic light emitting display.

FIG. 1A shows one embodiment of an organic light emitting display, which includes a display unit 120 formed from a plurality of sub-pixels P disposed in a matrix format and positioned on a substrate 110. The sub-pixels may emit light of different colors, e.g., red, green, white, orange, or any combination thereof, or may be white pixels which operate in combination with one or more color filters. Sub-pixels of other types may also be used. Also, it is understood that sub-pixels that emit different color light may be grouped to form pixel units to form an image. The sub-pixels may be formed from a phosphorescence material or a fluorescence material.

Because the sub-pixels in display unit 120 are susceptive to being exposed to moisture or oxygen, an adhesion member 140 is formed over the substrate and the sub-pixels are sealed with a sealing substrate 130.

A pad unit 150 is positioned at an external edge of the substrate at which the display unit is positioned. The pad unit is electrically connected to one or more external devices or drivers (not shown), which supply scan and data signals and power to the sub-pixels. The sub-pixels emit light based on the scan and data signals and received power.

Figure 1B:
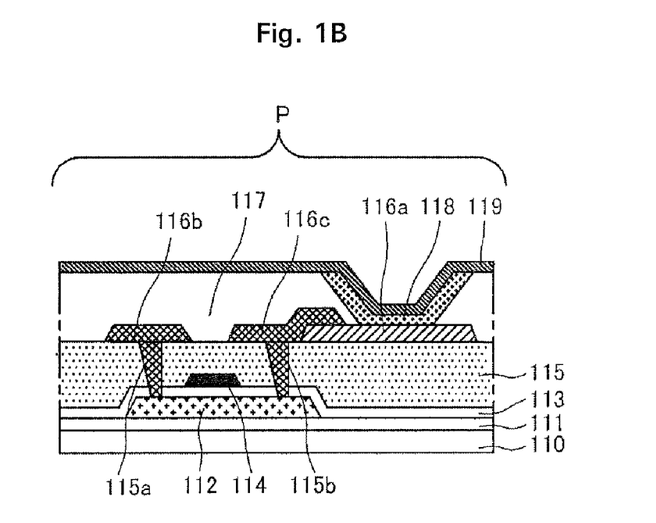
FIG. 1B is a cross-sectional view of one sub-pixel that may be included in the display of FIG. 1A.

FIG. 1B is a cross-sectional view of a sub-pixel that may be included in FIG. 1A. In this view, a buffer layer 111 is positioned on the substrate to protect a thin film transistor (to be formed in a subsequent process) from impurities such as an alkali ion leaking from the substrate. The buffer layer may be made of a silicone oxide ($SiO_2$), a silicone nitride ($SiN_x$), or another material.

A semiconductor layer 112 positioned on the buffer layer may be formed from silicon or polycrystalline silicon. Although not shown, the semiconductor layer may comprise channel, source, and drain areas, with p-type or n-type impurities doped in the source and drain areas.

A gate insulating film 113 is positioned on substrate 110 and may be made of a silicone oxide ($SiO_2$) or a silicone nitride ($SiN_x$).

A gate electrode 114 is positioned on the gate insulating film 113 preferably at a position that corresponds to the channel area, which is a predetermined area of the semiconductor layer 112. The gate electrode may made of aluminum (Al), aluminum alloy (Al alloy), titanium (Ti), silver (Ag), molybdenum (Mo), molybdenum alloy (Mo alloy), tungsten (W), or tungsten silicide ($WSi_2$).

An interlayer insulating film 115 is positioned on substrate 110 comprising the gate electrode. The interlayer insulating film may be made of an organic film, an inorganic film, or a composite film thereof. If the interlayer insulating film is or includes an inorganic film, the film 115 may be made of silicone oxide ($SiO_2$), silicone nitride ($SiN_x$), or silicate on glass (SOG). If film 115 is or includes an organic film, the film may be made of an acryl resin, polyimide resin, or benzocyclobutene (BCB) resin. First and second contact holes 115a and 115b for exposing a part of the semiconductor layer 112 may be positioned within the interlayer insulating film and gate insulator film.

A first electrode 116a is positioned on the interlayer insulating film. The first electrode may be an anode having a transparent conductive layer made of a material such as Indium Tin Oxide (ITO) or Indium Zinc Oxide (IZO). The first electrode 116a may also have a stacked structure, for example, made of ITO/Ag/ITO layers.

A source electrode 116b and drain electrode 116c are positioned on the interlayer insulating film. The source and drain electrodes are electrically connected to the semiconductor layer through first contact hole 115a and second contact hole 115b. Because a part of the drain electrode is positioned on first electrode 116a, the drain electrode is electrically connected to the first electrode.

The source electrode 116b and drain electrode 116c may be formed from a material having low resistance, in order to achieve lower conductive line resistance. Also, the source and drain electrodes may be a single layer film or a multiple layer film made of molybdenum (Mo), moly tungsten (Moly), titanium (Ti), aluminum (Al), or aluminum alloy (Al alloy). If each of the source and drain electrodes is a multiple layer film, a stacked structure of titanium/aluminum/titanium (Ti/Al/Ti), molybdenum/aluminum/molybdenum (Mo/Al/Mo), or moly tungsten/aluminum/moly tungsten (MoW/Al/MoW) may be used. However, the stacked structure is not limited to these materials.

A transistor positioned on the substrate comprises gate electrode 114, source electrode 116*b*, and drain electrode 116*c*, and a transistor array having a plurality of transistors and capacitors is electrically connected to an organic light emitting diode to be described in greater detail below.

An insulator film 117 for exposing part of first electrode 116*c* is positioned on first electrode 116*a*, e.g., which operates as an anode. The insulator film may be made of or include organic matter such as benzocyclobutene (BCB) resin, acryl resin, or polyimide resin.

An organic light emitting layer 118 is positioned on the exposed first electrode 116*a*, and a second electrode 119 is positioned on the organic light emitting layer. The second electrode may operate as a cathode for supplying electrons to the organic light emitting layer 118. The second electrode may be made of magnesium (Mg), silver (Ag), calcium (Ca), aluminum (Al), or alloys thereof.

An organic light emitting diode connected to the source electrode 116*b* or the drain electrode 116*c* may comprise the first electrode 116*a*, the organic light emitting layer 118, and the second electrode 119.

The first electrode 116*a*, positioned on the source electrode 116*b* or the drain electrode 116*c* of the transistor array, may be positioned on a planarization film for planarizing a surface of the transistor array. Further, the transistor array may have a different structure according to whether a gate is a top gate or a bottom gate. Further, the transistor array may have a different structure according to a semiconductor layer material and the quantity of masks used when the transistor array is formed.

Figure 2:
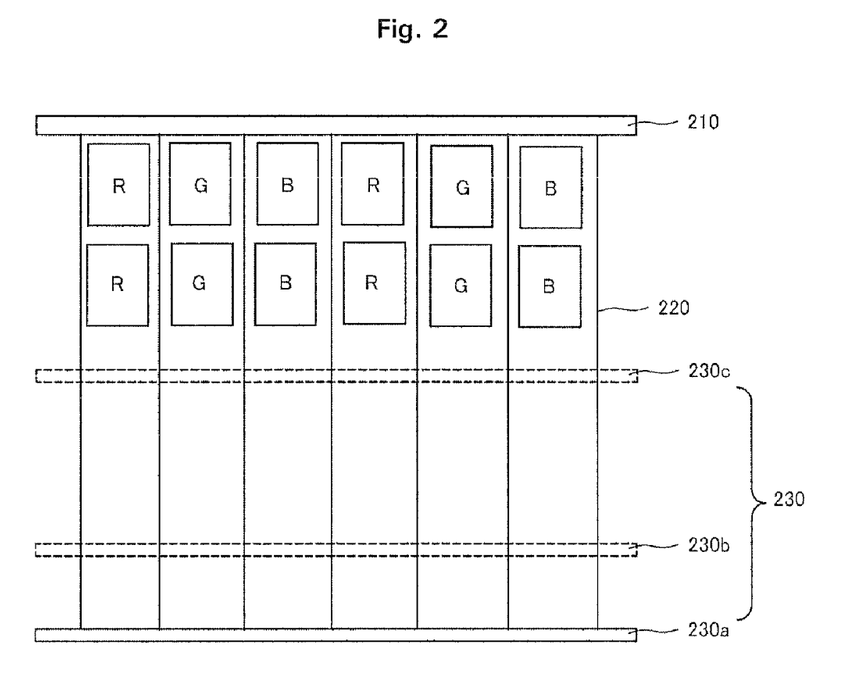
FIG. 2 is a diagram of a first implementation of a power conductive line that may be used in an organic light emitting display such as shown in FIG. 1A.

Referring again to FIG. 1A, scan signals, data signals, and power are supplied to sub-pixels P through scan conductive lines, data conductive line, and a power conductive lines respectively. FIG. 2 shows a first implementation of a power conductive line that may be included in the organic light emitting device in FIG. 1A.

Referring to FIG. 2, a main power conductive line 210 is disposed in a first direction adjacent to an area at which a pad unit (not shown) is positioned, so that power supplied through the pad unit (not shown) is supplied to a plurality of sub-pixels that emit different colors, e.g., R, G, and B.

A division power conductive line 220 is connected to the main power conductive line and is disposed in a second direction different from the first direction. Further, a sub-power conductive line 230 is connected to the division power conductive line 220 and is disposed in opposing relation to the main power conductive line.

The division power conductive line 220 is connected to a plurality of sub-pixels P. The sub-power conductive line 230 is connected to the division power conductive line 220 and is positioned in an area opposite to the main power conductive line 210 as in a first sub-power conductive line 230*a*. In other embodiments, the sub-power conductive line 230 may have a different position or orientation relative to the other lines. For example, the sub-power conductive line may be selectively positioned within a display unit (not shown) as in a second sub-power conductive line 230*b* or a third sub-power conductive line 230*c*.

In accordance with the first implementation, a width of the main power conductive line 210 is greater than widths of the division power conductive line 220 and sub-power conductive line 230. And, a width of the sub-power conductive line 230 is greater than the width of the division power conductive line 220.

Generally, power supplied from an external device is divided and supplied to the division power conductive line 220 and the sub-power conductive line 230 through the main power conductive line 210. This is because a current or a voltage injected into the main power conductive line 210 may be very large or the largest applied power.

The sub-power conductive line 230 may therefore be set to be wider than the division power conductive line 220 to allow the sub-power conductive line 230 to perform a compensating function for current or voltage in a specific area within the display unit (not shown). The compensating function will ensure that a current or voltage injected through the division power conductive line 220 does not deviate substantially or at all.

Figure 3:
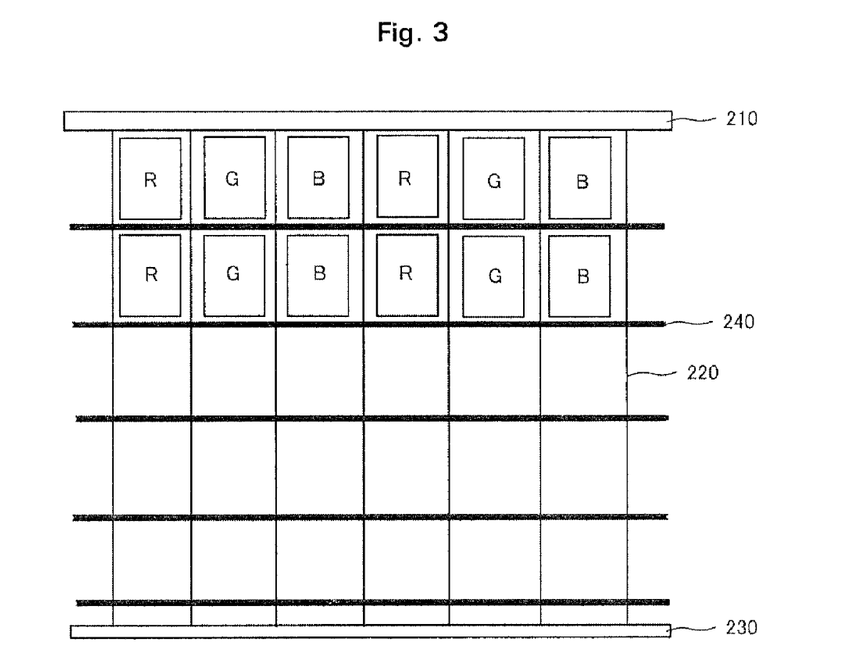
FIG. 3 is a diagram of a second implementation of a power conductive line that may be used in an organic light emitting display such as shown in FIG. 1A.

FIG. 3 shows a second implementation of a power conductive line that may be included in the organic light emitting display of FIG. 1A. In the second implementation, the main power conductive line 210 is disposed in a first direction adjacent to an area at which the pad unit (not shown) is positioned, so that power supplied through the pad unit (not shown) is supplied to a plurality of subpixels that emit different color light, e.g., R, G, and B.

The division power conductive line 220 is connected to the main power conductive line 210 and is disposed in a second direction different from the first direction. And, the sub-power conductive line 230 is connected to the division power conductive line 220 and is disposed in the first direction.

The division power conductive line 220 is connected to each of a plurality of sub-pixels P, and the sub-power conductive line 230 is preferably positioned in an area opposite the main power conductive line 210.

Also, in the second implementation, a width of the main power conductive line 210 is greater than widths of the division power conductive line 220 and sub-power conductive line 230. Also, a width of the sub-power conductive line 230 is greater than the width of a division power conductive line 220.

Generally, power supplied from an external device is divided and supplied to the division power conductive line 220 and the sub-power conductive line 230 through the main power conductive line 210. This is because a current or voltage injected into the main power conductive line 210 may be very large or the largest applied power.

Accordingly, the sub-power conductive line 230 may be set to be wider than that of the division power conductive line 220 in order to allow the sub-power conductive line 230 to perform a compensating function for current or voltage in an opposite side of the main power conductive line 210. As a result, current or a voltage injected through the division power conductive line 220 does not deviate substantially.

At least one connection power conductive line 240 is connected to the division power conductive line 220, is positioned to pass between pluralities of subpixels R, G, and B, and is disposed between the main power conductive line 210 and the sub-power conductive line 230. At least one connection power conductive line 240 is connected to each of the division power conductive lines 220.

In the second implementation, a width of at least one connection power conductive line 240 is narrower than that of the sub-power conductive line 230. This is because at least one connection power conductive line 240 is positioned between lines to compensate for conductive lines.

Also, at least one connection power conductive line 240 reduces a deviation in power supplied to a plurality of subpixels R, G, and B positioned at each line, and enables power supplied through the main power conductive line 210 to be uniformly supplied to an entire display unit. That is, by adding at least one connection power conductive line 240, the power conductive line has a net form which compensates (prevents) current or voltage from dropping in a specific area.

All of the connection power conductive lines 240 may have the same width, or in other embodiments they may have different widths.

Alternatively, because the connection power conductive line 240 is disposed to the main power conductive line 210, a width of the connection power conductive line 240 may become wide. And, because connection power conductive line 240 is disposed apart from the main power conductive line 210, i.e. as the connection power conductive line 240 is positioned adjacent to the sub-power conductive line 230, a width of the connection power conductive line 240 may become narrow. This is because when the same conductive lines width is used, current or voltage may drop in an area apart from the main power conductive line 210.

To prevent this from occurring, a width of at least one connection power conductive line 240 is wider than that of the division power conductive line 220. This can be realized because a width between a sub-pixel positioned at an n-th row and a subpixel positioned at an (n+1)th row is wider than that between subpixels positioned at an n-th row.

Because of the width between subpixels positioned at an n-th row or a width between the subpixel positioned at an n-th row and a subpixel positioned at an (n+1)th row, a width of the division power conductive line 220 may be wider than that of at least one connection power conductive line 240.

The second implementation shown in FIG. 3 may be varied in one or more ways. For example, according to one variation, only main power conductive line 210, division power conductive line 220, and connection power conductive line 240, but not the sub-power conductive line 230, may be disposed as the power conductive line.

Figure 4:
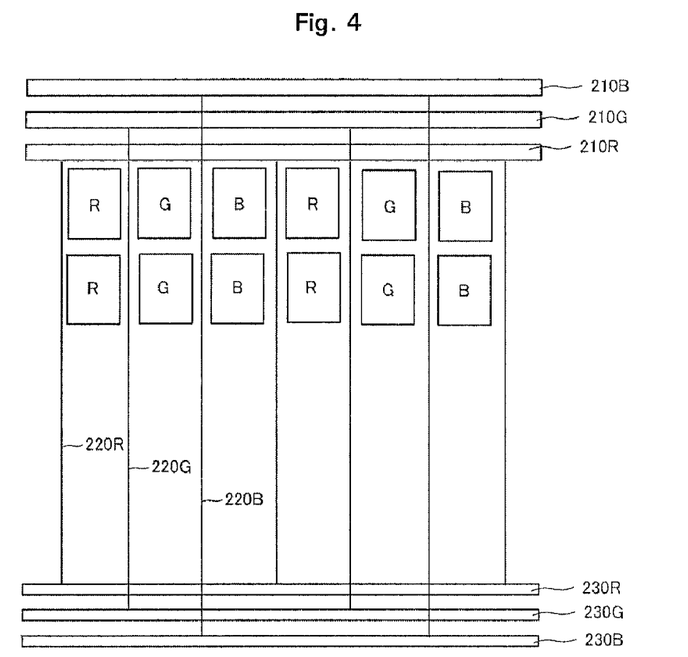
FIG. 4 is a diagram of a third implementation of a power conductive line that may be used in an organic light emitting display such as shown in FIG. 1A.

FIG. 4 shows a third implementation of a power conductive line that may be included in an organic light emitting display such as shown in FIG. 1A. Referring to FIG. 4, first, second, and third main power conductive lines 210R, 210G, and 210B are divided and disposed in a first direction adjacent to an area at which the pad unit (not shown) is positioned, so that power supplied through the pad unit (not shown) is supplied to each of at least three subpixels R, G, and B.

When each of the first, second, and third main power conductive lines 210R, 210G, and 210B is divided and positioned in this manner, each of at least three subpixels R, G, and B receives different power. This is because power required from each of at least three subpixels R, G, and B is different.

Further, first, second and third division power conductive lines 220R, 220G, and 220B are connected to the first, second, and third main power conductive lines 210R, 210G, and 210B, respectively, and are divided and disposed in a second direction different from the first direction.

Further, first, second, and third sub-power conductive lines 230R, 230G, and 230B are connected to the first, second, and third division power conductive lines 220R, 220G, and 220B, respectively, and are divided and disposed in the first direction.

The first, second, and third division power conductive lines 220R, 220G, and 220B are connected to each of a plurality of sub-pixels, e.g., R, G, and B. The first, second and third sub-power conductive lines 230R, 230G, and 230B are positioned in an area opposite to the first, second, and third main power conductive lines 210R, 210G, and 210B. However, a position of the first, second, and third sub-power conductive lines 230R, 230G, and 230B is not limited thereto. That is, the first, second, and third sub-power conductive lines 230R, 230G, and 230B may be selectively positioned within the display unit (not shown).

In accordance with the third implementation, a width of the first, second, and third main power conductive lines 210R, 210G, 210B may be greater than widths of the first, second, and third division power conductive lines 220R, 220G, 220B and the first, second, and third sub-power conductive lines 230R, 230G, and 230B. Further, a width of the first, second, and third sub-power conductive lines 230R, 230G, and 230B may be greater than widths of the first, second, and third division power conductive lines 220R, 220G, 220B.

This is because power is divided and supplied to the first, second, and third division power conductive lines 220R, 220G, and 220B and the first, second, and third sub-power conductive lines 230R, 230G, and 230B through the first, second, third main power conductive lines 210R, 210G, and 210B. That is, this is because a current or a voltage injected into the first, second, third main power conductive lines 210R, 210G, and 210B is very large or the largest applied power.

The first, second, and third sub-power conductive lines 230R, 230G, and 230B may be wider than that of the first, second, and third division power conductive lines 220R, 220G, and 220B to allow the first, second, and third sub-power conductive lines 230R, 230G, and 230B to perform a function of compensating for current or voltage at an opposite side of the first, second, third main power conductive lines 210R, 210G, and 210B. As a result, current or voltage injected through the first, second, and third division power conductive lines 220R, 220G, and 220B does not deviate substantially or at all.

Figure 5:
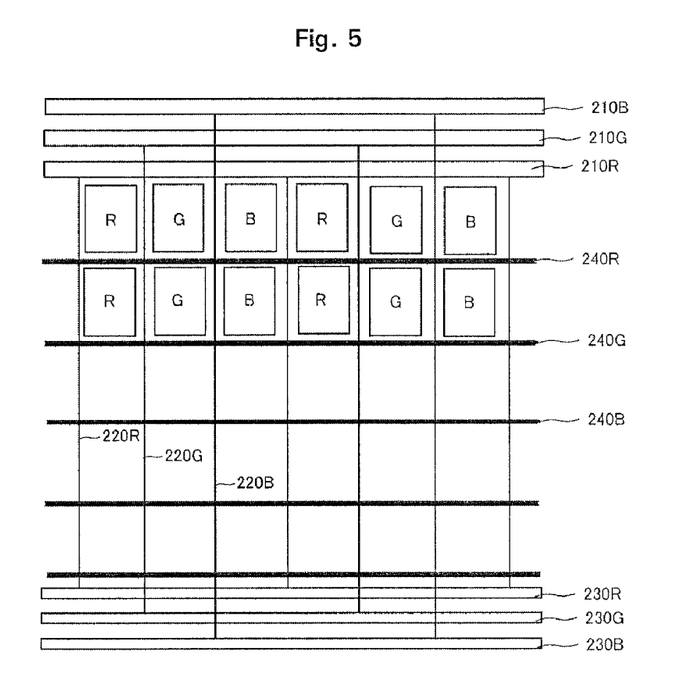
FIG. 5 is a diagram of a fourth implementation of a power conductive line that may be used in an organic light emitting display such as shown in FIG. 1A.

FIG. 5 shows a fourth implementation of a power conductive line that may be used in an organic light emitting display such as shown in FIG. 1A. In the fourth implementation, the first, second, and third main power conductive lines 210R, 210G, and 210B may be divided and disposed in the first direction adjacent to an area at which the pad unit (not shown) is positioned, so that power supplied through the pad (not shown) is supplied to each of at least three subpixels R, G, and B. If each of the first, second, and third main power conductive lines 210R, 210G, and 210B is divided and positioned in this manner, sub-pixels R, G, and B may receive different power. This is because power required for each of the sub-pixels R, G, and B may be different for operation.

Further, the first, second, and third division power conductive lines 220R, 220G, and 220B are connected to the first, second, and third main power conductive lines 210R, 210G, and 210B, respectively, and are divided and disposed in a second direction different from the first direction.

Further, the first, second, and third sub-power conductive lines 230R, 230G, and 230B are connected to the first, second, and third division power conductive lines 220R, 220G, and 220B, respectively, and are divided and disposed in the first direction.

The first, second, and third division power conductive lines 220R, 220G, and 220B are connected to each of a plurality of subpixels R, G, and B. The first, second, and third sub-power conductive lines 230R, 230G, and 230B are positioned in an area opposite to the first, second, and third main power conductive lines 210R, 210G, and 210B. However, a position of the first, second, and third sub-power conductive lines 230R, 230G, and 230B is not limited thereto. That is, the first, second, and third sub-power conductive lines 230R, 230G, and 230B may be selectively positioned within the display unit (not shown).

In accordance with the fourth implementation, a width of the first, second, and third main power conductive lines 210R, 210G, and 210B may be greater than widths of the first, second, and third division power conductive lines 220R, 220G, and 220B and the first, second, and third sub-power conductive lines 230R, 230G, and 230B. Further, widths of the first, second, and third sub-power conductive lines 230R, 230G, and 230B may be greater than widths of the first, second, and third division power conductive lines 220R, 220G, and 220B.

This is because power is divided and supplied to the first, second, and third division power conductive lines 220R, 220G, and 220B and the first, second, and third sub-power conductive lines 230R, 230G, and 230B through the first, second, and third main power conductive lines 210R, 210G, and 210B. That is, because current or voltage injected into the first, second, and third main power conductive lines 210R, 210G, and 210B is very large or the largest applied power.

The first, second, and third sub-power conductive lines 230R, 230G, and 230B are set to be wider than that of the first, second, and third division power conductive lines 220R, 220G, and 220B in order to allow the first, second, and third sub-power conductive lines 230R, 230G, and 230B to perform a function of compensating for current or voltage at an opposite side of the first, second, and third main power conductive lines 210R, 210G, and 210B. As a result current or a voltage injected through the first, second, and third division power conductive lines 220R, 220G, and 220B does not deviate substantially or at all.

First, second, and third connection power conductive lines 240R, 240G and 240B are connected to the first, second, and third division power conductive lines 220R, 220G, and 220B and are positioned to pass through between a plurality of subpixels R, G, and B. The first, second, and third connection power conductive lines 240R, 240G, and 240B are connected to the first, second, and third division power conductive lines 220R, 220G, and 220B, respectively.

A width of the first, second, and third connection power conductive lines 240 is narrower than that of the first, second, and third sub-power conductive lines 230R, 230G, and 230B. This is because the first, second, and third connection power conductive lines 240R, 240G, and 240B are positioned between lines to perform a function of compensating for a conductive line.

The first, second, and third connection power conductive lines 240R, 240G, and 240B reduce a deviation in power supplied to a plurality of subpixels R, G, and B positioned in each line and enables power supplied through the first, second, and third main power conductive lines 210R, 210G, and 210B to be uniformly supplied to an entire display unit. That is, by adding the first, second, and third connection power conductive lines 240R, 240G, and 240B, a power conductive line has a net form, whereby a current or a voltage is compensated not to drop in a specific area.

All of the first, second, and third connection power conductive lines 240R, 240G, and 240B may be formed to have the same width. Alternatively, as the first, second, and third connection power conductive lines 240R, 240G, and 240B are positioned to the first, second, and third main power conductive lines 210R, 210G, and 210B, a width of the first, second, and third connection power conductive lines 240R, 240G, and 240B may become wide. And, as the first, second, and third connection power conducive lines 240R, 240G, and 240B are positioned apart from the first, second, and third main power conductive lines 210R, 210G, and 210B, i.e. as the first, second, and third connection power conductive lines 240R, 240G, and 240B are adjacently positioned to the first, second, and third sub-power conductive lines 230R, 230G, and 230B, a width of the first, second, and third connection power conductive lines 240R, 240G, and 240B may become narrow.

This is because under a condition having the same conductive line width, as the first, second, and third connection power conductive lines 240R, 240G, and 240B are positioned apart from the first, second, and third main power conductive lines 210R, 210G, and 210B, a current or a voltage drops.

Widths of the first, second, and third connection power conductive lines 240R, 240G, and 240B are wider than that of the first, second, and third division power conductive lines 220R, 220G, and 220B. This is because the width between a subpixel positioned at an n-th row and a subpixel positioned at an (n+1)th row is wider than that between subpixels positioned at an n-th row.

However, because of the width between subpixels positioned at an n-th row and a width between a subpixel positioned at an n-th row and a subpixel positioned at an (n+1)th row, a width of the first, second, and third division power conductive lines 220R, 220G, and 220B may be wider than that of the first, second, and third connection power conductive lines 240R, 240G, and 240B.

In at least one of the aforementioned embodiments, because the first, second, and third connection power conductive lines 240R, 240G, and 240B are positioned further away from a power injection area, current or voltage drops due to conductive line resistance so that a problem that a deviation in brightness is generated between the subpixels can be solved.

When a conductive line width becomes larger, conductive line resistance is lower than that when conductive line width is smaller. However, in accordance with one or more of the foregoing embodiments, the power conductive line at least in a partial area is formed differently based on a width between sub-pixels. Moreover, the power conductive may be set to be within a range such that aperture ratio of the sub-pixels is not reduced. This may be accomplished, for example, by controlling a thickness of a power conductive line to be different, instead of using a method that involves increasing the width of the power conductive line.

As described above, by making a power conductive line structure of an organic light emitting display differently, a display quality of the organic light emitting display can be improved. Further, a problem that a current or a voltage drops in a specific area can be improved.

In one aspect, an organic light emitting display comprises: a display unit comprising a plurality of subpixels; a main power conductive line for supplying power to the plurality of subpixels and disposed in a first direction; a division power conductive line connected to the main power conductive line and divided and disposed in a second direction different from the first direction; and a sub-power conductive line connected to the division power conductive line and disposed opposite to the main power conductive line, wherein a width of the main power conductive line is wider than those of the division power conductive line and the sub-power conductive line.

In another aspect, an organic light emitting display comprises: a display unit comprising a plurality of subpixels; a main power conductive line for supplying power to the plurality of subpixels and disposed in a first direction; a division power conductive line connected to the main power conductive line and divided and disposed in a second direction different from the first direction; and at least one connection power conductive line connected to the division power conductive line and disposed to pass through between the plurality of subpixels, wherein a width of the main power conductive line is wider than those of the division power conductive line and the sub-power conductive line.

In still another aspect, an organic light emitting display comprises: a display unit comprising a plurality of subpixels; a main power conductive line for supplying power to the plurality of subpixels and disposed in a first direction; a division power conductive line connected to the main power conductive line and divided and disposed in a second direction different from the first direction; a sub-power conductive line connected to the division power conductive line and disposed opposite to the main power conductive line; and at least one connection power conductive line connected to the division power conductive line and positioned between the sub-power conductive line and the main power conductive line, wherein a width of the main power conductive line is wider than those of the division power conductive line, the connection power conductive line, and the sub-power conductive line.

In accordance with one or more of the embodiments described herein, the emitting layer may emit any one of a number of color light. In a case where the emitting layer emits red light, the emitting layer includes a host material including carbazole biphenyl (CBP) or 1,3-bis(carbazol-9-yl (mCP), and may be formed of a phosphorescence material including a dopant material including PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), or PtOEP(octaethylporphyrin platinum) or a fluorescence material including PBD:Eu(DBM)3(Phen) or Perylene.

In the case where the emitting layer emits red light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.0 to 6.0, and a lowest unoccupied molecular orbital of the dopant material may range from 2.4 to 3.5.

In the case where the emitting layer emits green light, the emitting layer includes a host material including CBP or mCP, and may be formed of a phosphorescence material including a dopant material including Ir(ppy)3(fac tris(2-phenylpyridine)iridium) or a fluorescence material including Alq3(tris(8-hydroxyquinolino)aluminum).

In the case where the emitting layer emits green light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

In the case where the emitting layer emits blue light, the emitting layer includes a host material including CBP or mCP, and may be formed of a phosphorescence material including a dopant material including (4,6-F2ppy)2Irpic or a fluorescence material including spiro-DPVBi, spiro-6P, distyryl-benzene (DSB), distyryl-arylene (DSA), PFO-based polymers, PPV-based polymers, or a combination thereof.

In the case where the emitting layer emits blue light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

Additional embodiments relating to various color image display methods in an organic light emitting device will now be described with reference to FIGS. 6A to 6C.

Figure 6A:
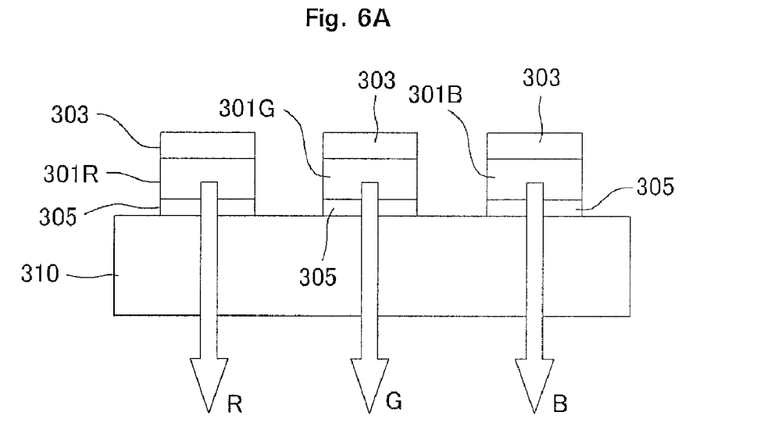
FIGS. 6A to 6C illustrate various implementations of a color image display method in an organic light emitting device according to one or more exemplary embodiments.
Figure 6B:
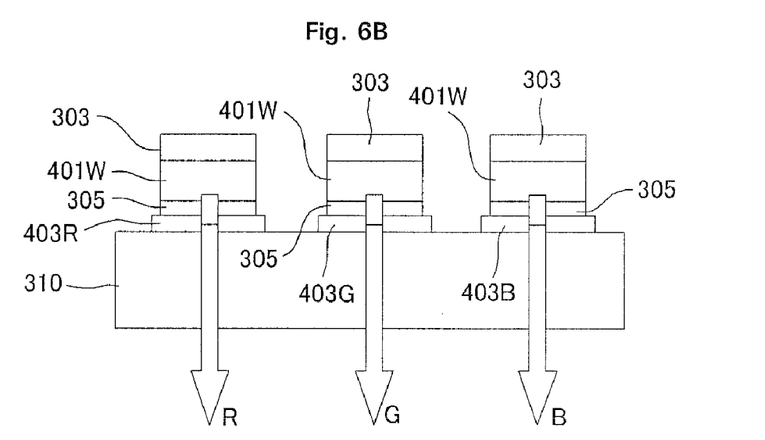
Figure 6C:
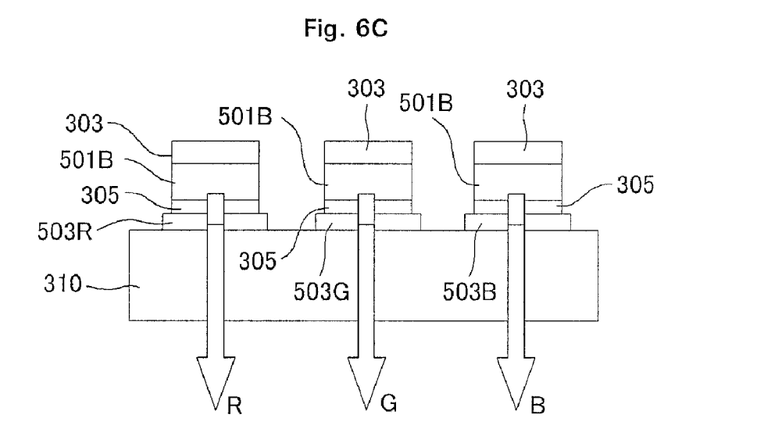

FIGS. 6A to 6C illustrate various implementations of a color image display method in an organic light emitting device according to one exemplary embodiment.

First, FIG. 6A illustrates a color image display method in an organic light emitting device separately including a red organic emitting layer 301R, a green organic emitting layer 301G and a blue organic emitting layer 301B which emit red, green and blue light, respectively.

The red, green and blue light produced by the red, green and blue organic emitting layers 301R, 301G and 301B is mixed to display a color image.

It may be understood in FIG. 6A that the red, green and blue organic emitting layers 301R, 301G and 301B each include an electron transporting layer, an emitting layer, a hole transporting layer, and the like. In FIG. 6B, a reference numeral 303 indicates a cathode electrode, 305 an anode electrode, and 310 a substrate. It is possible to variously change a disposition and a configuration of the cathode electrode, the anode electrode and the substrate.

FIG. 6B illustrates a color image display method in an organic light emitting device including a white organic emitting layer 401W, a red color filter 403R, a green color filter 403G and a blue color filter 403B. And the organic light emitting device further may include a white color filter (not shown).

As illustrated in FIG. 6B, the red color filter 403R, the green color filter 403G and the blue color filter 403B each transmit white light produced by the white organic emitting layer 401W to produce red light, green light and blue light. The red, green and blue light is mixed to display a color image.

It may be understood in FIG. 6B that the white organic emitting layer 401W includes an electron transporting layer, an emitting layer, a hole transporting layer, and the like.

FIG. 6C illustrates a color image display method in an organic light emitting device including a blue organic emitting layer 501B, a red color change medium 503R and a green color change medium 503G.

As illustrated in FIG. 6C, the red color change medium 503R and the green color change medium 503G each transmit blue light produced by the blue organic emitting layer 501B to produce red light, green light and blue light. The red, green and blue light is mixed to display a color image.

It may be understood in FIG. 6C that the blue organic emitting layer 501B includes an electron transporting layer, an emitting layer, a hole transporting layer, and the like.

A difference between driving voltages, e.g., the power voltages VDD and Vss of the organic light emitting device may change depending on the size of the display panel 100 and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
|---|---|---|---|
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
| --- | --- |
| S < 3 inches | 4~20 (V) |
| 3 inches < S < 20 inches | 5~25 (V) |
| 20 inches < S | 5~30 (V) |

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An organic light emitting device comprising:
a display unit having a plurality of sub-pixels;
a main power conductive line disposed in a first direction to supply power to the sub-pixels;
a division power conductive line connected to the main power conductive line and disposed in a second direction different from the first direction; and
at least one connection power conductive line connected to the division power conductive line and disposed to pass between respective pairs of the sub-pixels,
wherein a width of the main power conductive line is greater than widths of the division power conductive line and the connection power conductive line, and
wherein the at least one connection power conductive line includes a first connection power conductive line and a second connection power conductive line, wherein the first connection power conductive line is positioned more adjacently to the main power conductive line than the second connection power conductive line, and wherein a width of the first connection power conductive line is greater than a width of the second connection power conductive line.

2. The organic light emitting device of claim 1, wherein each of the sub-pixels includes a phosphorescence material.

3. The organic light emitting device of claim 1, wherein a width of the connection power conductive line is greater than the width of the division power conductive line.

4. The organic light emitting device of claim 1, wherein the division power conductive line is connected to the subpixels.

5. The organic light emitting device of claim 1, wherein the main power conductive line includes first, second, and third main power conductive lines which supply power to sub-pixels that emit light of different colors.

6. The organic light emitting device of claim 5, wherein the division power conductive line includes first, second, and third division power conductive lines which are connected to respective ones of the first, second, and third main power conductive lines.

7. The organic light emitting device of claim 6, wherein the connection power conductive line includes first, second, and third connection power conductive lines which are connected to respective ones of the first, second, and third division power conductive lines.

8. An organic light emitting device comprising:
a display unit having a plurality of sub-pixels;
a main power conductive line disposed in a first direction to supply power to the sub-pixels;
a division power conductive line connected to the main power conductive line and disposed in a second direction different from the first direction;
a sub-power conductive line connected to the division power conductive line and disposed opposite to the main power conductive line; and
at least one connection power conductive line connected to the division power conductive line and positioned between the sub-power conductive line and the main power conductive line, wherein a width of the main power conductive line is greater than widths of the division power conductive line, connection power conductive line, and sub-power conductive line, and
wherein a width of a connection power conductive line adjacent to the main power conductive line is greater than a width of a connection power conductive line adjacent to the sub-power conductive line.

9. The organic light emitting device of claim 8, wherein each of the sub-pixels includes a phosphorescence material.

10. The organic light emitting device of claim 8, wherein the width of the sub-power conductive line is greater than the width of the division power conductive line.

11. The organic light emitting device of claim 8, wherein the width of the connection power conductive line is greater than the width of the division power conductive line.

12. The organic light emitting device of claim 8, wherein the width of the sub-power conductive line is greater than the width of the connection power conductive line.

13. The organic light emitting device of claim 8, wherein the main power conductive line comprises first, second, and third main power conductive lines that supply power to sub-pixels that emit light of different colors.

14. The organic light emitting device of claim 13, wherein the division power conductive line includes first, second, and third division power conductive lines which are connected to respective ones of the first, second, and third main power conductive lines.

15. The organic light emitting device of claim 14, wherein the sub-power conductive line includes first, second, and third sub-power conductive lines that are connected to respective ones of the first, second, and third division power conductive lines.

16. The organic light emitting device of claim 14, wherein the connection power conductive line includes first, second, and third connection power conductive lines which are connected to respective ones of the first, second, and third division power conductive lines.

* * * * *